United States Patent
Park

(10) Patent No.: US 7,436,246 B2
(45) Date of Patent: Oct. 14, 2008

(54) PIN NUMBER REDUCTION CIRCUIT AND METHODOLOGY FOR MIXED-SIGNAL IC, MEMORY IC, AND SOC

(75) Inventor: Sangbeom Park, San Jose, CA (US)

(73) Assignee: ANA Semiconductor, Tracy, CA (US)

( * ) Notice: Subject to any disclaimer, the term of this patent is extended or adjusted under 35 U.S.C. 154(b) by 44 days.

(21) Appl. No.: 11/711,399

(22) Filed: Feb. 26, 2007

(65) Prior Publication Data

US 2008/0204120 A1    Aug. 28, 2008

(51) Int. Cl.
    *G05F 1/10* (2006.01)
(52) U.S. Cl. .................................... 327/540
(58) Field of Classification Search ............. 327/530, 327/534, 535, 537, 540, 541
    See application file for complete search history.

(56) References Cited

U.S. PATENT DOCUMENTS

| 6,531,914 B2 * | 3/2003 | Kawakubo | 327/541 |
| 6,542,026 B2 * | 4/2003 | Wu et al. | 327/540 |
| 7,030,686 B2 * | 4/2006 | Itoh | 327/541 |

* cited by examiner

Primary Examiner—Jeffrey S Zweizig

(57) ABSTRACT

The pin number reduction circuit circuits and methodology of the present invention provide a higher pseudo power supply and a lower pseudo power supply for a digital functional section in mixed-signal IC, memory IC, and SOC including analog functional section and digital (or memory) functional section in order to reduce digital noise coupling. The circuit and methodology of the present invention basically includes resistors, capacitors, transistors, and amplifiers. It is noted that analog functional section is coupled between a positive power supply and a negative power supply, which are connected to two pins.

One amplifier with a PMOS transistor and one resistor string provides a higher pseudo power supply, and the other amplifier with an NMOS transistor and the other resistor string provides a lower pseudo power supply so that a digital functional section is coupled between these pseudo power supplies. Furthermore, the methodology provides multiple higher pseudo power supplies and multiple lower pseudo power supplies for multiple digital (or memory) functional sections to reduce a great number of pins by dividing a complex system into modules based on well-define function, interface, and power dissipation.

20 Claims, 4 Drawing Sheets

PIN NUMBER REDUCTION CIRCUIT AND METHODOLOGY FOR MIXED-SIGNAL IC, MEMORY IC, AND SOC

FIELD OF THE INVENTION

The present invention relates to the field of mixed-signal integrated circuits and system-on-chip and more particularly to pin number reduction circuit and methodology for mixed-signal integrated circuits, memory integrated circuits and system-on-chip basically utilizing resistors, capacitors, transistors, and amplifiers.

BACKGROUND ART

Prior to the mid-1970s, MOS technology was utilized primarily for memory and logic functions, and the analog functions such as operational amplifiers were typically implemented by using bipolar integrated circuits [Paul R. Gray et al., Analysis and Design of Analog Integrated Circuits, second edition, John Wiley & Sons]. However, in recent years, the steady increases in chip complexity brought about by continuing improvements in lithographic resolutions have created the economic incentive to implement subsystems or systems containing both analog and digital functions on a single mixed-signal integrated circuit or a single system-on-chip. In addition, the steady increases in memory chip density have demand the economic incentive to implement systems containing both analog and memory functions on a single memory integrated circuit, a multi-die package (i.e., multi-die in a single package), or a same printed circuit board. In single mixed-signal IC (i.e., integrated circuit), single memory IC or single system-on-chip, the problem of digital noise coupling is not negligible and the circuit and methodology for its avoidance are very important. Digital noise coupling has been caused by capacitive couplings, coupling through power supply, and coupling through substrate or ground. Thus, in order to solve one of digital noise coupling problems, it has required extra pins so that separate pins for analog functional section and digital functional section (or memory functional section) are used. It is here assumed that one pad is connected to one pin.

Prior Art FIG. 1 illustrates a circuit diagram of conventional separate pins for an analog functional section and a digital functional section for mixed-signal IC (i.e., integrated circuit) and SOC (i.e., system-on-chip). Prior Art FIG. 1 is comprised of an analog functional section coupled between a positive analog power supply 151 and a negative analog power supply (or analog ground) 161, and also composed of a digital functional section coupled between a positive digital power supply 152 and a negative digital power supply (or digital ground) 162. Unfortunately, the conventional separate pins for an analog functional section and a digital functional section 100 is very expensive to implement in integrated circuit (IC) chip because more number of pins has greatly increased the chip cost as well as printed circuit board cost.

Thus, what is needed is cost-effective pin number reduction circuit for mixed-signal IC, memory IC, and SOC that can be efficiently implemented along with minimizing digital noise coupling and maximizing marketing advantages. The present invention satisfies these needs by providing pin number reduction circuit and methodology for mixed-signal IC, memory IC, and SOC basically utilizing resistors, capacitors, transistors, and amplifiers.

SUMMARY OF THE INVENTION

The present invention provides pin number reduction circuit and methodology for mixed-signal IC, memory IC, and SOC including analog functional section and digital (or memory) functional section. The circuit and methodology of the present invention basically includes resistors, capacitors, transistors, and amplifiers. It is noted that analog functional section is coupled between a positive power supply and a negative power supply, which are connected to two pins. Using these power supplies, one amplifier with a PMOS transistor and one resistor string provides a higher pseudo power supply, and the other amplifier with an NMOS transistor and the other resistor string provides a lower pseudo power supply. A digital function section is coupled between these two pseudo power supplies. In this configuration, the two transistors are used as common-source amplifier and each amplifier receives a reference voltage at its negative input. Furthermore, the present invention achieves a drastic improvement in pin number reduction for mixed-signal IC, memory IC, and SOC along with effectively reducing digital noise coupling. Therefore, it has greatly decreased the chip cost as well as printed circuit board cost, and provides one of the strongest marketing advantages.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

DESCRIPTION OF THE PREFERRED EMBODIMENTS

In the following detailed description of the present invention, cost-effective pin number reduction circuit for mixed-signal IC, memory IC, and SOC, numerous specific details are set forth in order to provide a through understanding of the present invention. However, it will be obvious to one skilled in the art that the present invention may be practiced without these specific details. In other instances, well known methodology, procedures, components, and circuits have not been described in detail so as not to unnecessarily obscure aspects of the present invention.

Figure 1:
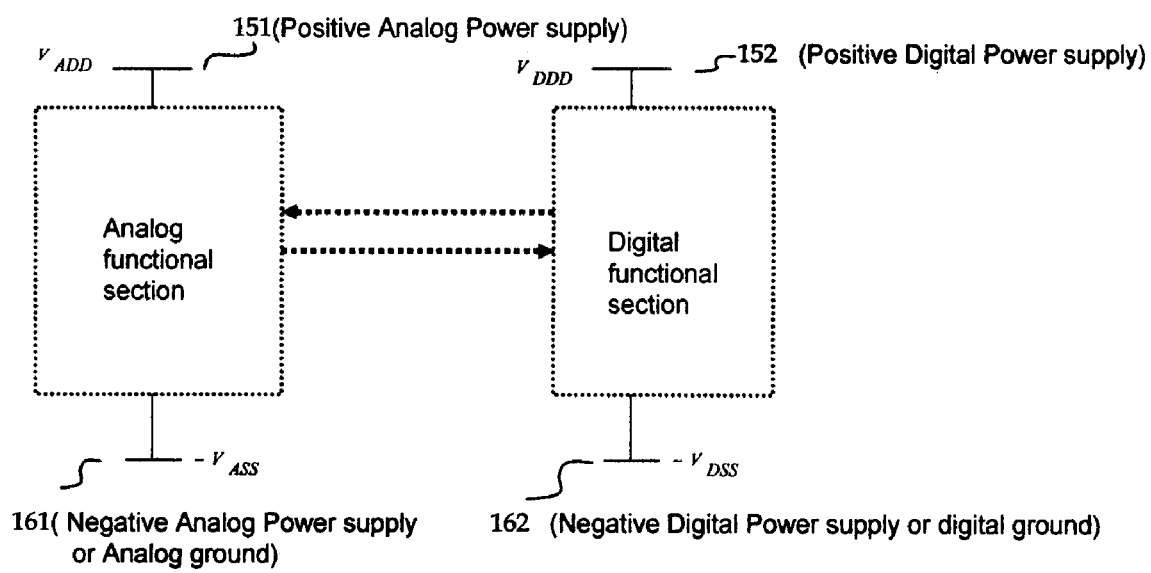
FIG. 1 illustrates a circuit diagram of conventional separate pins for an analog functional section and a digital functional section for mixed-signal IC, memory IC, and SOC (i.e., system-on-chip).
Figure 2:
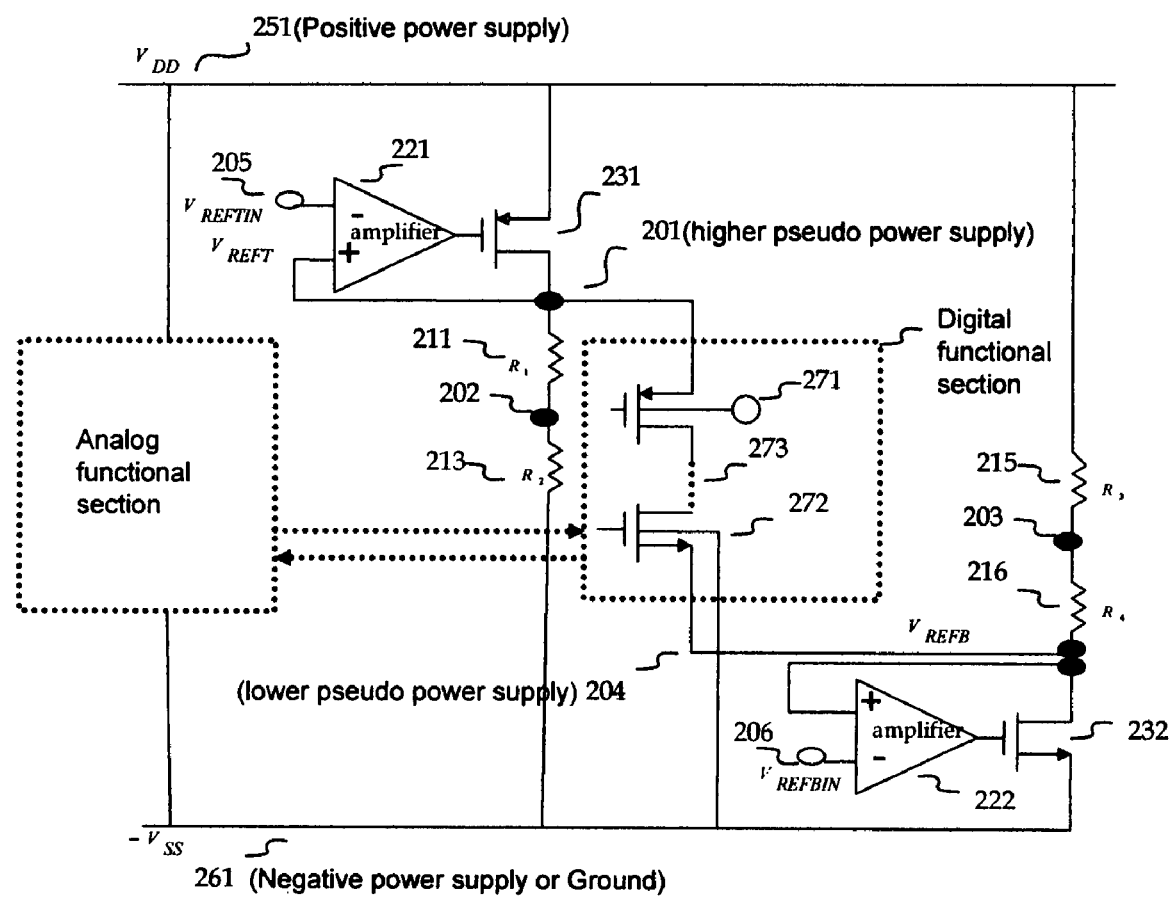
FIG. 2 illustrates a circuit diagram of a pin number reduction circuit for mixed-signal IC, memory IC, and SOC including analog functional section and digital functional section in accordance with the present invention.

FIG. 2 illustrates a pin number reduction circuit for mixed-signal IC, memory IC, and SOC including analog functional section and digital functional section in accordance with the present invention. An analog functional section is coupled between a node 251 (i.e., a positive power supply) and a node 261 (i.e., a negative power supply), which are connected to two pins. The pin number reduction circuit for mixed-signal IC, memory IC, and SOC 200 provides a higher pseudo power supply and a lower pseudo power supply for a digital (or memory) functional section. The circuit 200 is comprised of a first resistor string 211 and 213, a second resistor string 215 and 216, a PMOS transistor (i.e., a first transistor) 231, an NMOS transistor (i.e., a second transistor) 232, and two amplifiers (or operational amplifiers) 221 and 222. The two transistors 231 and 232 are used as common-source amplifier. The amplifier 221 and amplifier 222 are termed first amplifier and second amplifier, respectively. Each amplifier (or operational amplifier) receives a reference voltage at its negative input. It is noted that the positive input terminal of the amplifier 221 is connected to the drain node of the PMOS transistor 231 and its output terminal is connected to the gate node of the PMOS transistor 231. The amplifier 221 and PMOS transistor 231 are in negative feedback configuration. Likewise, the amplifier 222 and NMOS transistor 232 are in negative feedback configuration. If the amplifiers 221 and 222 have a reasonable gain, then their positive input voltage and negative input voltage are equal. In other words, assuming that $V_{REFTIN}$ (i.e., top reference voltage input, voltage at node 205) and $V_{REFBIN}$ (i.e., bottom reference voltage input, voltage at node 206) are proper voltage levels, voltage at a node 201 (i.e., $V_{REFT}$, higher pseudo power supply) becomes equal to $V_{REFTIN}$ and voltage at a node 204 (i.e., $V_{REFB}$, lower pseudo power supply) becomes equal to $V_{RERBIN}$. The digital functional section coupled between the node 201 (i.e., higher pseudo power supply) and the node 204 (i.e., lower pseudo power supply) consists of a great number of logic gates, which basically include PMOS transistors and NMOS transistors.

An example of a gate in the digital functional section is illustrated here. The gate is composed of a top PMOS transistor 271, m transistors 273, and a bottom NMOS transistor 272. The dotted lines 273 represent m transistors where m is an integer greater than or equal to zero. Transistors 271, 272, and 273 are connected in series between the node 201 and the node 204 in a path from the higher pseudo power supply to the lower pseudo power supply. The source node of the top PMOS transistor 271 and source node of the bottom NMOS transistor 272 are coupled to the node 201 (i.e., higher pseudo power supply) and the node 204 (i.e., lower pseudo power supply), respectively. Furthermore, each bulk of all PMOS transistors in the digital functional section is connected to their own drain node, the higher pseudo power supply, or the positive power supply. However, each bulk of all NMOS transistors in the digital functional section must be connected to the node 261 (i.e., negative power supply, ground).

Amplifiers are well known circuits in the art and can be implemented using various well known devices such as transistors, capacitors, resistors, etc. In addition, the amplifiers (or operational amplifiers) 221 and 222 are differential-input single-ended output amplifiers and can have any number of gain stages with or without buffer stage (i.e., output stage).

Figure 3:
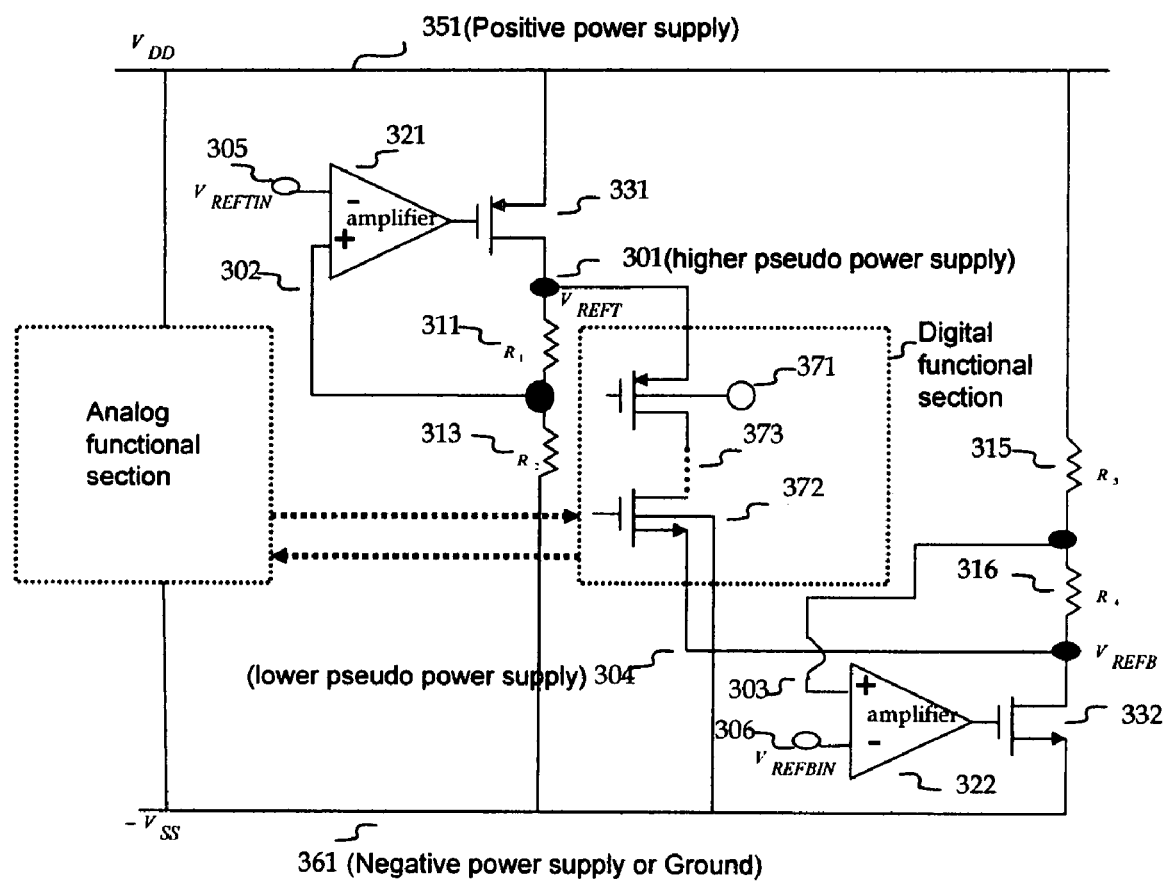
FIG. 3 illustrates a circuit diagram of a modified pin number reduction circuit for mixed-signal IC, memory IC, and SOC including analog functional section and digital functional section according to the present invention.

FIG. 3 illustrates a circuit diagram of a modified pin number reduction circuit for mixed-signal IC, memory IC, and SOC including analog functional section and digital functional section 300 according to the present invention. An analog functional section is coupled between a node 351 (i.e., positive power supply) and a node 361 (i.e., negative power supply), which are connected to two pins. The modified pin number reduction circuit for mixed-signal IC, memory IC, and SOC 300 provides a higher pseudo power supply and a lower pseudo power supply for a digital (or memory) functional section. The circuit 300 is comprised of a first resistor string 311 and 313, a second resistor string 315 and 316, a PMOS transistor (i.e., a first transistor) 331, an NMOS transistor (i.e., a second transistor) 332, and two amplifiers (or operational amplifiers) 321 and 322. The amplifiers 321 and 322 are termed first amplifier and second amplifier, respectively. The dotted lines 373 represent m transistors where m is an integer greater than or equal to zero. In addition, it is also noted that the amplifier 321, PMOS transistor 331, and resistor 311 shown in FIG. 3 are in negative feedback configuration in the same fashion as the amplifier 221 and PMOS transistor 231. It is also noted that each bulk of all NMOS transistors in the digital functional section must be connected to the node 361 (i.e., negative power supply, ground).

However, a difference between FIG. 2 and FIG. 3 is that the resistor 311 shown in FIG. 3 is included in one feedback path, and the resistor 316 is included in the other feedback path. Thus, even though $V_{REFTIN}$ (i.e., top reference voltage input, voltage at node 305) is not close to $V_{DD}$ and $V_{REFBIN}$ (i.e., bottom reference voltage input, voltage at node 306) is not close to $-V_{SS}$ (or ground), voltage at a node 301 (i.e., $V_{REFT}$, higher pseudo power supply) and voltage at a node 304 (i.e., $V_{REFB}$, lower pseudo power supply) become a higher pseudo power supply voltage closed to $V_{DD}$ and a lower pseudo power supply voltage closed to $-V_{SS}$ (or ground), respectively. The modified pin number reduction circuit for mixed-signal IC, memory IC, and SOC 300 is highly effective when $V_{REFTIN}$ is not high enough and $V_{REFBIN}$ is not low enough.

Figure 4:
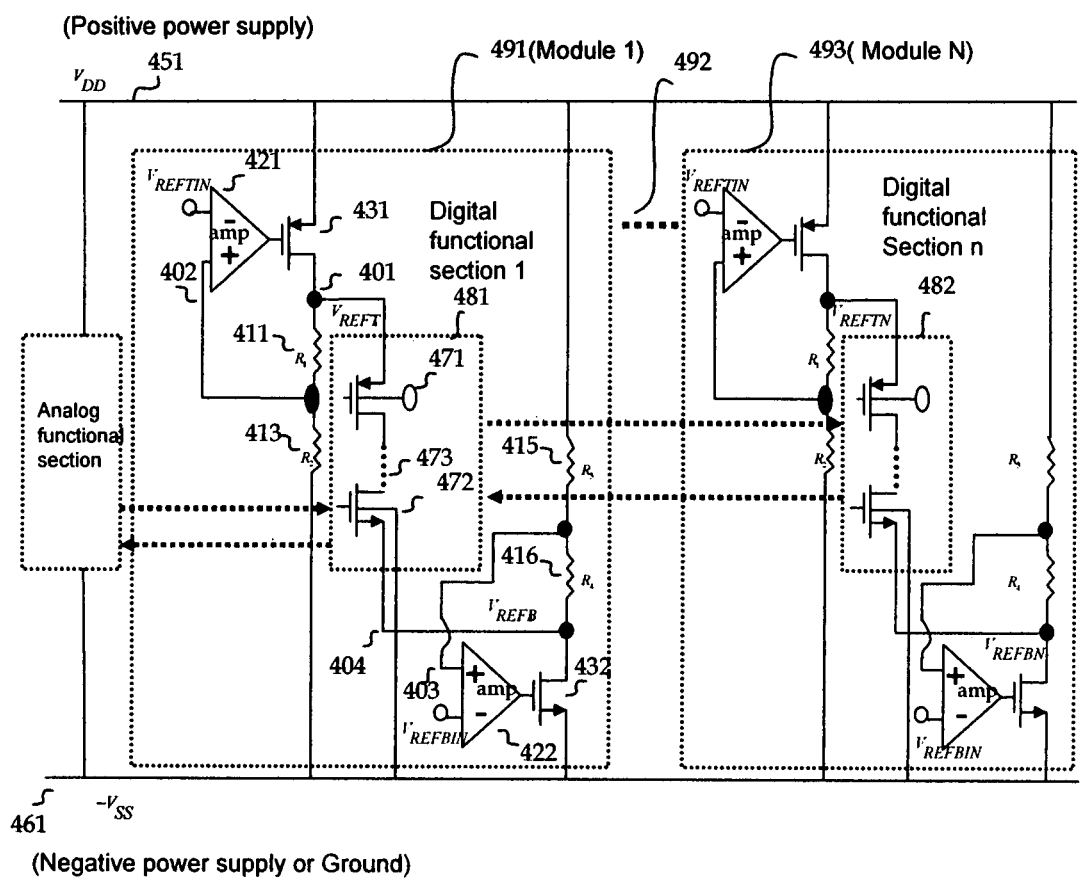
FIG. 4 illustrates a circuit diagram of pin number reduction circuits and methodology for complex mixed-signal IC, memory IC, and SOC including analog functional section and multiple digital functional sections in accordance with the present invention.

FIG. 4 illustrates a circuit diagram of pin number reduction circuits and methodology for complex mixed-signal IC, memory IC, and SOC including analog functional section and digital functional section 400 according to the present invention. An analog functional section is coupled between a node 451 (i.e., a positive power supply) and a node 461 (i.e., a negative power supply), which are connected to two pins. The pin number reduction circuits and methodology for complex mixed-signal IC, memory IC, and SOC 400 provide n higher pseudo power supplies and n lower pseudo power supplies for n digital (or memory) functional sections. Furthermore, the use of the methodology involves dividing a complex system into modules based on well-define function, interface, and power dissipation. Thus, the circuit 400 is comprised of n sets of modules where n is an integer greater than one. A module is comprised of a digital (or memory) functional section and a pin number reduction circuit. The dotted lines 492 represent n-2 sets of modules.

Since the circuit 400 can provide multiple higher pseudo power supplies and multiple lower pseudo power supplies for complex digital (or memory) functional section, it achieves a drastic improvement in pin number reduction by minimizing digital noise coupling for complex mixed-signal IC, memory IC, and SOC including analog functional section and digital (or memory) functional section.

In summary, the pin number reduction circuit 200 and the modified pin number reduction circuit 300 can also be implemented using additional capacitors attached to the nodes 201 through 204 and the nodes 301 through 304, respectively. The present invention utilizes resistors, capacitors, transistors, and amplifiers (or operational amplifiers). The pin number reduction circuits and methodology of the present invention provide one of the greatest low-cost solutions for mixed-signal IC, memory IC, and SOC, and can be efficiently implemented along with minimizing digital noise coupling. They have greatly decreased the chip cost as well as printed circuit board cost, and provide one of the strongest marketing positions. While the present invention has been described in particular embodiments, it should be appreciated that the present invention should not be construed as being limited by such embodiments, but rather construed according to the claims below.

What is claimed is:

1. A pin number reduction circuit and methodology providing a higher pseudo power supply and a lower pseudo power supply for a digital functional section in mixed-signal IC, memory IC, and system-on-chip, comprising:
   a first resistor string and a first transistor connected in series between a positive power supply and a negative power supply for generating the higher pseudo power supply at any node between serially coupled components that mean the first transistor and resistors of the first resistor string in a path from the positive power supply to the negative power supply, wherein the first transistor has a drain node connected to the top node of the first resistor string;
   a first amplifier having a negative input that receives a top reference voltage input, a positive input that is connected to a node between serially coupled resistors of the first resistor string, and an output terminal that is connected to a gate node of the first transistor;
   a second resistor string and a second transistor connected in series between the positive power supply and the negative power supply for generating the lower pseudo power supply at any node between serially coupled components that mean resistors of the second resistor string and the second transistor in a path from the positive power supply to the negative power supply, wherein the second transistor has a drain node connected to the bottom node of the second resistor string;
   a second amplifier having a negative input that receives a bottom reference voltage input, a positive input that is connected to a node between serially coupled resistors of the second resistor string, and an output terminal that is connected to a gate node of the second transistor; and
   wherein the digital functional section is coupled between the higher pseudo power supply and the lower pseudo power supply.

2. The circuit as recited in claim 1 wherein the pin number reduction circuit and methodology provide a higher pseudo power supply and a lower pseudo power supply for a digital functional section.

3. The circuit as recited in claim 1 wherein the pin number reduction circuit and methodology provide n higher pseudo power supplies and n lower pseudo power supplies for n digital functional sections where n is an integer greater than one.

4. The circuit as recited in claim 1 wherein the digital functional section is digital functional section.

5. The circuit as recited in claim 1 wherein the digital functional section is memory functional section.

6. The circuit as recited in claim 1 wherein the digital functional section further comprises all NMOS transistors having their bulk nodes connected to the negative power supply.

7. The circuit as recited in claim 1 wherein the digital functional section further comprises all NMOS transistors having their bulk nodes connected to ground.

8. The circuit as recited in claim 1 wherein the positive power supply and negative power supply are connected to two pins.

9. The circuit as recited in claim 1 wherein the amplifiers make their positive input voltage and negative input voltage equal.

10. The circuit as recited in claim 1 wherein the amplifiers are differential-input single-ended output amplifiers.

11. The circuit as recited in claim 1 wherein the amplifiers are differential-input single-ended output operational amplifiers.

12. The circuit as recited in claim 1 wherein power-down transistors can be added to nodes between the serially coupled resistors so that the nodes are at ground during power-down mode.

13. The circuit as recited in claim 1 wherein a capacitor can be coupled between the output terminal of the first amplifier and the top node of the first resistor string.

14. The circuit as recited in claim 1 wherein a capacitor can be coupled between the output terminal of the second amplifier and the bottom node of the second resistor string.

15. The circuit as recited in claim 1 wherein a resistor and a capacitor connected in series can be coupled between the output terminal of the first amplifier and the top node of the first resistor string.

16. The circuit as recited in claim 1 wherein a resistor and a capacitor connected in series can be coupled between the output terminal of the second amplifier and the bottom node of the second resistor string.

17. The circuit as recited in claim 1 wherein capacitors can be added to the output terminals of the two amplifiers, the two pseudo power supplies, the nodes between the serially coupled resistors of the first resistor string, and the nodes between the serially coupled resistors of the second resistor string.

18. The circuit as recited in claim 1 wherein the negative power supply is negative power supply.

19. The circuit as recited in claim 1 wherein the negative power supply is ground.

20. The circuit as recited in claim 1 wherein the pin number reduction circuit and methodology are developed for use in any integrated circuit and multi-die in a single package.

* * * * *